United States Patent [19]

Shoji

[11] 4,438,349

[45] Mar. 20, 1984

[54] HYSTERESIS CIRCUIT HAVING A STABLE OUTPUT FREE FROM NOISE SUPERPOSED ON INPUT SIGNAL

[75] Inventor: Masashi Shoji, Tokyo, Japan

[73] Assignee: Nippon Electric Co., Ltd., Tokyo, Japan

[21] Appl. No.: 315,537

[22] Filed: Oct. 27, 1981

[30] Foreign Application Priority Data

Oct. 29, 1980 [JP] Japan .................... 55-151796

[51] Int. Cl.³ .................... H03K 5/24; H03K 5/153
[52] U.S. Cl. .................... 307/362; 307/354; 307/359; 330/253; 330/257; 330/260
[58] Field of Search .................... 307/355, 356, 359, 362, 307/354; 330/253, 257, 260

[56] References Cited

U.S. PATENT DOCUMENTS 3,988,595 10/1976 Eatock .................... 307/355

Primary Examiner—John Zazworsky
Attorney, Agent, or Firm—Laff, Whitesel, Conte & Saret

[57] ABSTRACT

A hysteresis circuit has first and second input terminals and an output terminal. An input signal is supplied to the first input terminal, while the second input terminal receives a reference voltage. Control electrodes of first and second transistors are connected to the first and second input terminals. The two transistors are interconnected to form a differential amplifier having an output which is supplied to a phase-inversion amplifier. The output of the phase-inversion amplifier is fed to the output terminal. The load impedances of both the first and second transistors are varied depending upon the output condition of the output terminal. For example, when the output terminal is in one output condition, a third transistor is turned on and a fourth transistor is turned off. When the output terminal is in an opposite output condition, the conduction conditions of the third and fourth transistors are reversed. In other words, each time that the voltage level at the output terminal is inverted, the load impedance of both the first and second transistors are varied, to change the gain of the differential amplifier. This gain variation is fed back to reinforce the output condition.

15 Claims, 5 Drawing Figures

HYSTERESIS CIRCUIT HAVING A STABLE OUTPUT FREE FROM NOISE SUPERPOSED ON INPUT SIGNAL

BACKGROUND OF THE INVENTION

The present invention relates to a comparator for providing an output signal having a hysteresis characteristic with respect to an input signal, and more particularly to a hysteresis circuit composed of complementary insulated gate field effect transistors.

The heretofore known comparator having a hysteresis characteristic comprises an operational amplifier and a resistance voltage-divider circuit. The operational amplifier has a first input terminal supplied with an input signal voltage and a second input terminal. The resistance voltage-divider circuit has a first resistor connected between an output terminal and the second input terminal of the operational amplifier and a series connection of a second resistor and a reference voltage source connected between the second input terminal and a ground terminal. However, this known comparator has shortcomings because a hysteresis voltage may be varied due to the internal impedance of the reference voltage source and because the resistance ratio becomes too large to be realized in an integrated circuit. This ratio is between the first and second resistors which are used for obtaining a large width of the hysteresis characteristic.

An hysteresis circuit overcoming the above-mentioned shortcomings, has been described in U.S. Pat. No. 4,069,431 granted for N. Kucharewski and issued on Jan. 17, 1978. This circuit makes use of a current mirror amplifier (CMA) having a current gain which is controlled responsive to an output condition. More particularly, the CMA is connected to a differential amplifier, as an active load. The differential amplifier receives an input signal and a reference voltage. A switching transistor having a gate connected to the circuit output terminal is connected in parallel with a conduction path on the output terminal side of the CMA. If this switching transistor is an N-channel enhancement type insulated gate field effect transistor, when the amplifier circuit output terminal is at a low level, the switching transistor is non-conductive. Accordingly, the current gain of the CMA is not varied. Whereas, when the circuit output terminal is at a high level, the switching transistor becomes conductive, to lower the impedance of the conduction path of the CMA on the output terminal side. In other words, the gain of the CMA is varied. By using this gain variation, a hysteresis characteristic is provided.

However, this amplifier circuit has a shortcoming since a slight noise superposed on the input signal may change the output level, upon the output inversion. This is because the CMA gain would not be varied unless the voltage level of the circuit output terminal reaches one stable condition level after having moved from the other stable condition level. This shortcoming will be described below in more detail, assuming that the switching transistor is of an N-channel type.

When the input signal voltage is decreased and then reaches one input level at which the output condition is inverted, the output voltage is increased, for example, from a low level toward a high level. This increased output voltage exceeds a threshold level of the switching transistor, and then this transistor is turned on. Consequently, the gain of the CMA is varied. This gain variation is fed back to enhance the output condition variation, and hence the output level changes abruptly to the high level. Since the threshold level of the switching transistor is relatively low, the gain variation is generated by the slight level increase of the output voltage.

When the input signal voltage is increased and then reaches the other input level at which the output condition changes from a high level to a low level, the output voltage is decreased. However, as long as the decreased output voltage is higher than the threshold level of the switching transistor, it does not turn off. In other words, the gain variation of the CMA does not occur. As the input signal voltage further increases, the output level further decreases and then, when the output voltage becomes smaller than the threshold level of the switching transistor, it is turned off. Then, the gain of the CMA is varied. As a result of this variation, the output level is abruptly decreased to the low level. Thus, the gain variation of the CMA is not produced by the output voltage from the high level to the threshold level of the switching transistor. Since the threshold voltage is very low, it can be said that, at the inversion point of the output voltage from the high level to the low level, the gain variation of the CMA would not occur. Consequently, as the input signal voltage is increased, the output signal voltage is decreased gradually. For this reason, the noise superposed on the input signal might possibly cause a malfunction of a load circuit connected to the output terminal.

In order to eliminate this shortcoming, the above-identified U.S. patent provides a buffer amplifier such as an inverter which is connected between the differential amplifier and an output terminal. For instance, the inverter has its threshold level equal to one-half of the power supply voltage. When the input signal level exceeds the threshold level or becomes lower than the threshold level, the output condition of the inverter is changed rapidly. Therefore, even if the voltage at the output of the differential amplifier circuit terminal is descreased gradually as described above, unless it becomes lower than the threshold voltage of the inverter, the output voltage level of the inverter is not be inverted. When the output terminal voltage has become lower than the threshold level of the inverter, the output level of the inverter is changed. Accordingly, a steep output voltage waveform can be obtained by the added inverter.

However, it is to be noted that when the output condition of the inverter is varied, the gain of the CMA has not yet been varied. This means that a noise superposed on the input signal is also input to the inverter. For this reason, the input voltage level of the inverter is varied by the noise. In other words, the output condition of the inverter becomes indeterminate due to the noise. As described above, the amplifier circuit having a hysteresis characteristic, according to the prior art, lacks the stability of the output condition with respect to noises.

Moreover, according to the prior art, there was another shortcoming that one of the input signal voltages at which the output condition is inverted is fixed at the reference voltage.

SUMMARY OF THE INVENTION

It is, therefore, a major object of the present invention to provide a hysteresis circuit which is hardly influenced by a noise in an input signal.

Another object of the present invention is to provide a hysteresis circuit which generates an output signal of a stable and steep voltage waveform.

Still another object of the present invention is to provide a hysteresis circuit in which both of the input levels at which the output condition is to be inverted can be controlled without being fixed at a reference voltage.

A hysteresis circuit according to the present invention comprises first and second input terminals and an output terminal. An input signal is supplied to the first input terminal, while the second input terminal receives a reference voltage. The first and second input terminals are respectively connected to control electrodes of first and second transistors, which are interconnected to form a differential amplifier. The first and second transistors have respective load circuits. The output of the differential amplifier is supplied to a phase-inversion amplifier. The output of the phase-inversion amplifier is fed to the output terminal. Third and fourth transistors are connected in parallel with the respective load circuits of the first and second transistors, respectively. The control electrode of the third transistor is connected to the output end of the phase-inversion amplifier, while the control electrode of the fourth transistor is connected to the input end of the phase-inversion amplifier.

Accordingly, the load impedances of the first and second transistors are both varied depending upon the output condition of the output terminal due to the third and fourth transistors. When the output terminal is in one output condition, for example, the third transistor is turned on and the fourth transistor is turned off. When the output terminal is in the other output condition, the conduction conditions of the third and fourth transistors are reversed. In other words, each time the level of output terminal is inverted, the load impedance of both the first and second transistors are varied. This implies the variation of the gain of the differential amplifier. This gain variation is fed back to reinforce the output condition from one output condition to the other output condition and from the other output condition to one output condition. As a result, the voltage waveform obtained at the output terminal becomes very steep. Moreover, in quick response to the condition of the output terminal, the gain is varied momentarily, and then the output enters into a stable condition. Accordingly, the influence of noise superposed on an input signal at the moment of output inversion can be reliably prevented. Still further, the third transistor of the fourth transistor is reliably turned on, depending on the output. In other words, the gain of the differential amplifier in varied in response to the output condition. Therefore, two input levels at which the output level is inverted can be set irrespective of the reference voltage.

BRIEF DESCRIPTION OF THE DRAWINGS

The above-mentioned and other objects, features and advantages of the present invention will become more apparent by reference to the following detailed description taken in conjunction with the accompanying drawings, wherein.

DETAILED DESCRIPTION OF THE PRIOR ART

Figure 1:
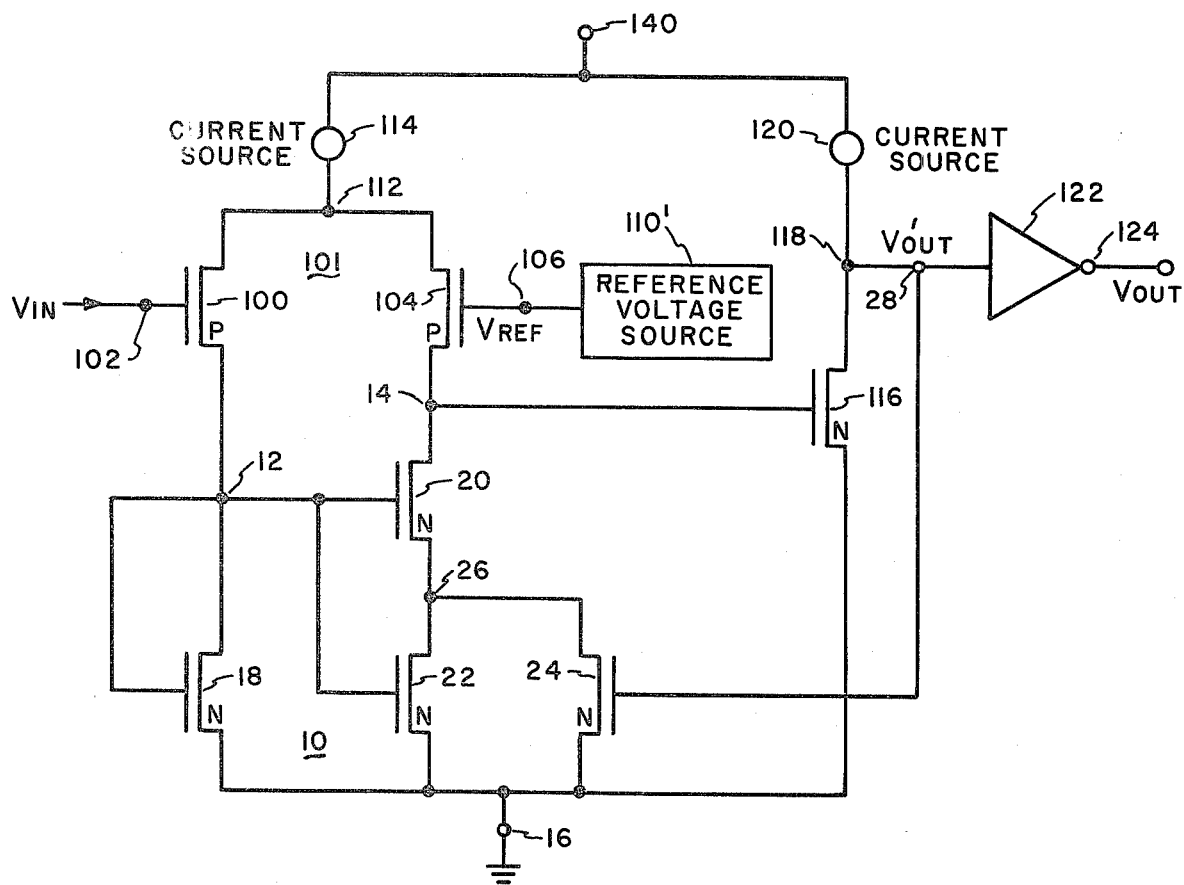
FIG. 1 is a circuit diagram of a hysteresis circuit having a hysteresis characteristic according to the prior art.
Figure 3:
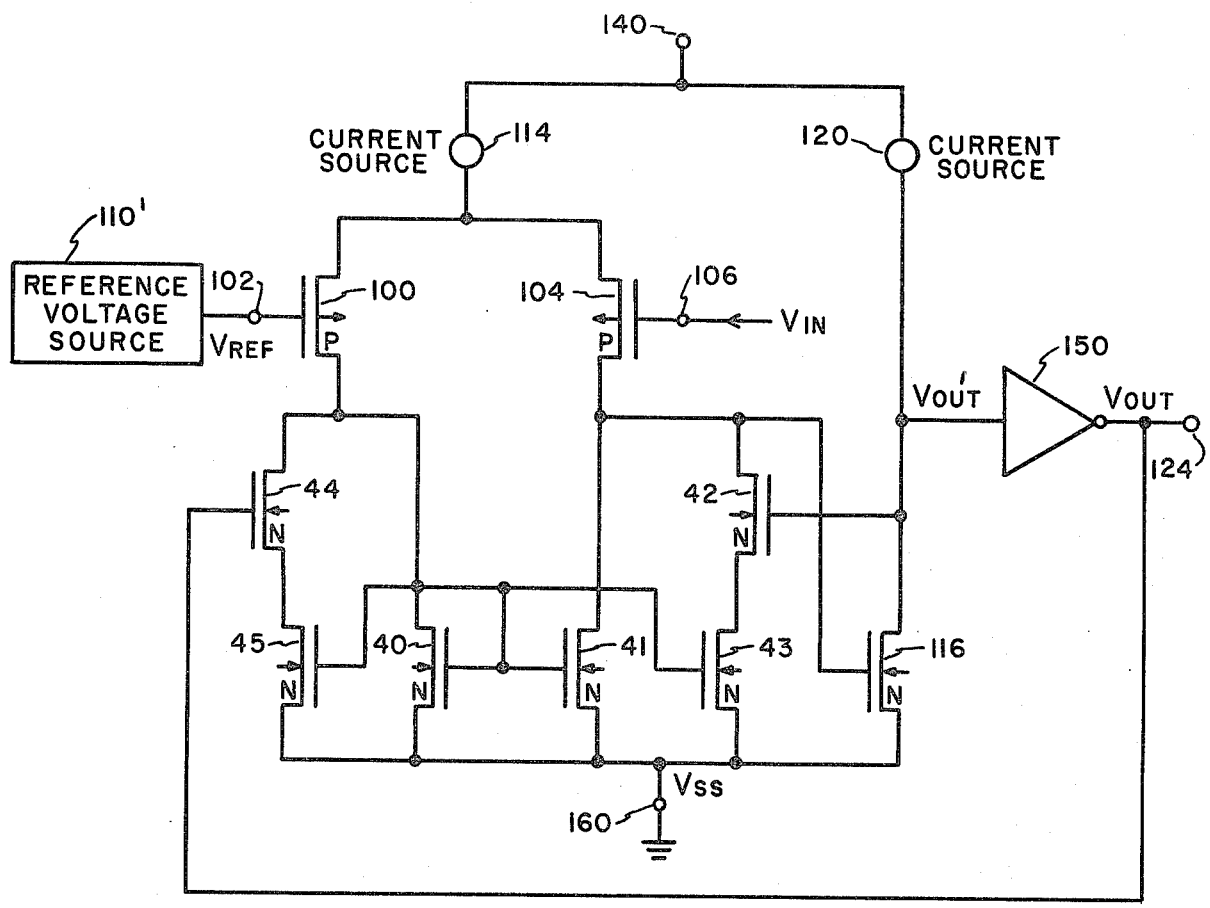
FIG. 3 is a circuit diagram of a hysteresis circuit according to one preferred embodiment of the present invention.

FIG. 1 shows a circuit which is substantially the same as the hysteresis circuit shown in FIG. 3 of the above-referred U.S. patent. The prior art is specific to an example in which an input voltage $V_{IN}$ is applied to a terminal 102 and in which a reference voltage $V_{REF}$ is applied from a reference voltage source 110' to a terminal 106.

The description will be made of the operation of this circuit with reference to the waveform diagram shown in FIG. 2, and the above-described shortcomings of this circuit will be described in greater detail.

When the input signal voltage $V_{IN}$ which is applied to the input terminal 102 is higher than the reference voltage $V_{REF}$ applied to the other input terminal 106, due to the fact that transistors 100 and 104 forming a differential amplifier 101 are of P-channel type, the transistor 104 is conducting and the transistor 100 is non-conducting. A current fed from a current source 114 flows via a node 112 through the transistor 104. Accordingly, a transistor 116 is turned on, so that a voltage $V'_{OUT}$ appears at a terminal 28 connected to a node 118 which is between a current source 120 and the transistor 116. The voltage $V'_{OUT}$ is nearly at the ground level at a terminal 16, as shown in FIG. 2. An output level of an inverter 122, that is, an output voltage $V_{OUT}$ at an output terminal 124 is approximately equal to a voltage at a voltage source terminal 140 (this voltage being represented by $V_{DD}$). At this moment, a transistor 24 is non-conducting because its gate is at the ground level. Accordingly, there is no conduction path through the transistor 24.

When the input signal voltage $V_{IN}$ is decreased and then becomes equal to the reference voltage $V_{REF}$, substantially equal currents flow through the transistors 100 and 104. The current passing through the transistor 100 flows through a transistor 18 having its drain and gate connected to a node 12. The current from the transistor 104 flows through transistors 20 and 22. Consequently, the gate voltage of the transistor 116, that is, the voltage at the node 14 is reduced, so that the current flowing through the drain-source path of the transistor 116 is decreased. Consequently, the voltage $V'_{OUT}$ at the terminal 28 rises. When this voltage $V'_{OUT}$ exceeds the threshold voltage $V_T$ of the transistor 24, this transistor 24 is turned on. Hence the additional conduction path through the transistor 24 is formed between a node 26 and the terminal 16. This path is in parallel with the conduction path through the transistor 22. Therefore, the voltage at the node 14 falls abruptly, and the transistor 116 is turned off. In other words, the gain of the CMA 10 is varied, and this gain variation is fed back to quickly turn off the transistor 116. As a result, the voltage $V'_{OUT}$ abruptly rises up to the $V_{DD}$ level, and the output voltage $V_{OUT}$ at the output terminal 124 is quickly reduced to the ground level.

A further decrease of the input signal voltage $V_{IN}$ has no effect on the output condition. The above-mentioned output condition of the circuit is kept stable.

Assume now that the input signal voltage $V_{IN}$ is increased to a level equal to the reference voltage $V_{REF}$, a current begins to flow through the transistor 104. However, since the transistor 24 is in the conductive condition, there is no generated voltage at the node 14 for turning the transistor 116 on. Accordingly, the voltages $V'_{CUT}$ and $V_{OUT}$ hold their previous conditions without any change.

A further increase of the input signal voltage $V_{IN}$ causes an increase of current flowing through the transistor 104, and hence the voltage at the node 14 is increased. At the time when the input signal voltage $V_{IN}$ is increased to an input level $V'_{tH}$, a channel is produced in the transistor 116 by the voltage applied from the node 14, so that a current begins to flow through this transistor 116. At this moment, however, the formation of a channel is slight, and hence the current value is small. Consequently, the voltage drop at the terminal 28 is small. Therefore, to the gate of the transistor 24 is continuously applied a sufficient voltage for making this transistor 24 conduct. As the input signal voltage increases further, the voltage at the node 14 is further increased and the current through the transistor 116 is also increased, so that the voltage $V'_{OUT}$ at the terminal 28 decreases. Subsequently, when the input signal voltage $V_{IN}$ reaches an input level $V''_{tH}$ and the voltage $V'_{OUT}$ at the terminal 28 becomes smaller than the threshold voltage $V_T$ of the transistor 24, this transistor 24 is turned off. Thus, the circuit shown in FIG. 1 executes a linear operation during the period when the input signal voltage $V_{IN}$ increases from $V'_{tH}$ to $V''_{tH}$. In other words, this circuit operates without a gain variation of the CMA 10. When the transistor 24 is turned off, the conduction path through the transistor 24 is cut off. Consequently, the voltage at the node 14 increases abruptly. By this voltage increase, the transistor 116 is biased to conduct a sufficient current, so that the voltage $V'_{OUT}$ at the terminal 28 closes to the ground level.

Figure 2:
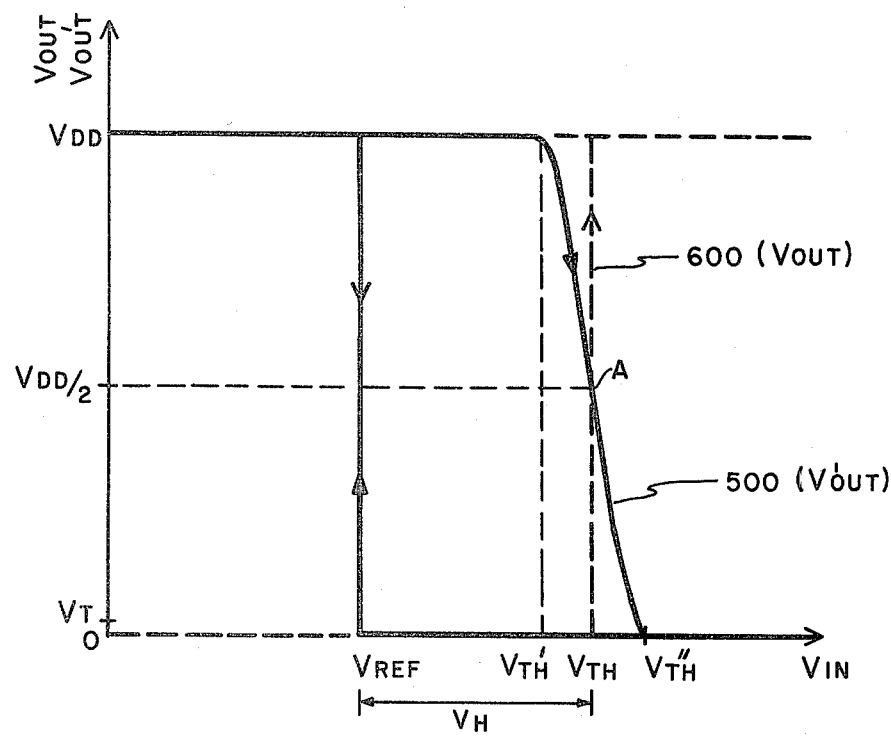
FIG. 2 is a waveform diagram showing a relationship of an input signal voltage versus an output signal voltage of the circuit shown in FIG. 1.

As will be apparent from the above explanation, the variation of the the voltage $V'_{OUT}$ at the terminal 28 in response to the variation of the input signal voltage $V_{In}$ presents a voltage waveform as shown by a solid line 500 in FIG. 2. As seen from this figure, since the threshold level $V_T$ of the transistor 24 is relatively small, the voltage $V'_{OUT}$ at the terminal 28 presents a grade in its waveform from the $V_{DD}$ level to the ground level. It is to be noted that this curve of gradual inversion is determined by a product of the gain of the transistor 116 and by the gain of the differential amplifier stage 101. The gain of the differential amplifier stage is determined by a product of a mutual conductance of the differential amplifier 101 and an output impedance at the node 14. Although this curve will vary depending upon the above-mentioned parameters, it more or less presents such a graded curve in its output turning characteristics. As described above, during the period when the voltage $V'_{OUT}$ at the terminal 28 varies from the $V_{DD}$ level to the ground level, the gain of the CMA does not vary. For this reason, a noise included in the input signal $V_{IN}$ is also amplified and appears at the terminal 28.

To the terminal 28 is connected an input of the inverter 122. The inverted output produced by the inverter 122 is derived from an output terminal 124, as an output of this hysteresis circuit. Accordingly, the phase of the output voltage $V_{OUT}$ at the output terminal 124 is opposite to the phase of the voltage $V'_{OUT}$ at the terminal 28. In addition, unless the input voltage $V'_{OUT}$ to the inverter 122 exceeds or becomes lower than the threshold voltage of the inverter (one-half of the power supply voltage $V_{DD}$), the output condition of the inverter 122 is not inverted. Accordingly, the output voltage $V_{OUT}$ is held at the ground level until the voltage $V'_{OUT}$ at the terminal 28 is varied from the $V_{DD}$ level to the $V_{DD}/2$ level. When the voltage $V'_{OUT}$ becomes lower than the $V_{DD}/2$ level, the output of the inverter 122 is inverted, so that the output voltage $V_{OUT}$ rises abruptly up to the $V_{DD}$ level. Therefore, the output voltage $V_{OUT}$ presents a voltage waveform as shown by a dotted heavily-inked line 600. Thus, this prior circuit has an output characteristic such that the output condition is inverted at the input levels of $V_{REF}$ and $V_{tH}$. A *hysteresis voltage width is a difference voltage $V_H$ between $V_{REF}$ and $V_{tH}$.*

However, it should be noted that a noise superposed on the input signal $V_{IN}$ is also applied to the inverter 122 through the differential amplifier 101 and the transistor 116. For this reason, the input voltage to the inverter 122 may possibly fluctuate above and below the threshold level of the inverter 122, responsive to the noise superposed on the input signal $V_{IN}$ corresponding to the point A where the voltage $V'_{OUT}$ at the terminal 28 takes the $V_{DD}/2$ level. As a result, the output voltage $V_{OUT}$ of the inverter 122 becomes indeterminate and repeatedly takes to $V_{DD}$ level and the ground level. Even if buffer amplifiers such as inverters or the like are connected in a plurality of stages to the output terminal 124, the above-mentioned shortcoming is unavoidable so long as the gain of the CMA is not varied.

DETAILED DESCRIPTION OF PREFERRED EMBODIMENTS

FIG. 3 shows a circuit diagram of a hysteresis circuit according to one preferred embodiment of the present invention. The transistors used in the circuit shown in FIG. 3 are, similar to transistors shown in FIG. 1. All transistors are enhancement type insulated gate field effect transistors such as, for example, field effect transistors having a metal-oxide-semiconductor (MOS) structure.

Sources of P-channel MOS (P-MOS) transistors 100 and 104 are connected in common, and further are connected via a current source 114 to a power supply terminal 140 for feeding a voltage of $V_{DD}$. The gate of the transistor 100 is connected to an input terminal 102. This terminal 102 is supplied with a reference voltage $V_{REF}$ from a reference voltage source 110'. The gate of the transistor 104 is connected to the other input terminal 106 to which an input signal voltage $V_{IN}$ is applied. The drain of the transistor 100 is connected to a common junction point of the gate and drain of an N-channel MOS (N-MOS) transistor 40.

The source of the transistor 40 is connected to a power supply terminal 160 for feeding a level of $V_{SS}$. In the FIG. 3, the $V_{SS}$ level is the ground level. If desired, the $V_{SS}$ level may take a negative voltage level. The gate of the transistor 40 is connected to the gate of an N-MOS transistor 41. The drain-source path of the transistor 41 is connected between the drain of the transistor 104 and the terminal 160. Accordingly, a current mirror circuit is constructed of the transistors 40 and 41. In parallel with the drain-source path of the transistor 41 is connected a series circuit comprising N-MOS transistors 42 and 43.

The gate of the transistor 43 is connected in common with the gates of the transistors 40 and 41, and the gate of the transistor 42 is connected to the drain of an N-MOS transistor 116. The gate of the transistor 116 is connected to the drain of the transistor 104. The N-MOS transistors 44 and 45 are connected in series, and the drain of the transistor 44 is connected to the drain of the transistor 40. The gate of the transistor 45 is connected in common with the gate of the transistor 40, and the source of the transistor 45 is connected to the terminal 160. The gate of the transistor 44 is connected to the output terminal 124. The drain of the transistor 116 is connected via an inverter 150 to the output terminal 124, and is also connected via a current source 120 to the power supply terminal 140. The inverter 150 is preferably constructed by the series connected P and N-MOS transistors. The current sources 114 and 120, respectively, may be composed of resistors having a high resistance, transistors having a fixed source-gate voltage or cascaded transistors, which preferably feed a constant current.

Now, the operation of the above-described hysteresis circuit will be explained with reference to a voltage waveform diagram shown in FIG. 4.

When the input signal voltage $V_{IN}$ is a sufficiently low voltage, as compared with the reference voltage $V_{REF}$, the transistor 104 is conductive, while the transistor 100 is non-conductive. Hence the current fed from the current source 114 flows through the transistor 104. Therefore, a sufficiently high voltage is applied to the gate of the transistor 116, so that this transistor 116 is conductive. As a result, the input voltage ($V'_{OUT}$) of the inverter 150 is nearly at the $V_{SS}$ level, and the output voltage $V_{OUT}$ at the output terminal 124 is at the $V_{DD}$ level (a first stable condition). Then, since the input voltage ($V'_{OUT}$) of the inverter 150 is at the $V_{SS}$ level, the transistor 42 is non-conductive. Accordingly, there is no conduction path through the transistors 42 and 43. Since the transistor 44 is conductive at this moment, there is a conduction path through the transistor 44 and the transistor 45, in parallel with the conduction path of the transistor 40.

Assume now that the input signal voltage $V_{IN}$ is increased to a value equal to the reference voltage $V_{REF}$. Approximately equal currents flow through the transistors 100 and 104, respectively. However, due to the presence of the conduction path including the transistors 44 and 45 and the conduction path of the transistor 40, the transistor 100 does not have the capability of passing a sufficiently large current to supply these two conduction paths. Consequently, the drain voltage of the transistor 100 is lower than that of the transistor 104. In other words, due to the current flowing through the transistor 45, the current flowing through the transistor 40 is small. Therefore, the drain voltage of the transistor 104 is sufficiently high. As a result, the transistor 116 maintains its conductive condition, and the output voltage $V_{OUT}$ is held in the first stable condition.

A further increase of the input signal voltage $V_{IN}$ feeds a sufficiently large current through the transistor 100 and feeds a smaller current through the transistor 104. Eventually, when the input signal voltage $V_{IN}$ reaches a $V_{tH}$ level, a sufficiently large voltage cannot be obtained at the drain of the transistor 104, that is, at the gate of the transistor 116, so that the drain voltage of the transistor 116 is increased. The transistor 42 is made conductive by the increased drain voltage of the transistor 116. Therefore, a conduction path consisting of this transistor 42 and the transistor 43 is connected in parallel with the conduction path of the transistor 41 to lower the load impedance of the transistor 104. Consequently, the gate voltage of the transistor 116 is lowered abruptly, and hence the transistor 116 is turned off. In other words, the gain of the differential amplifier including the transistors 100 and 104 is varied, and the gain variation is fed back to reinforce the turn-off of the transistor 116. As a result, the input voltage ($V'_{OUT}$) of the inverter 150 is abruptly increased to the $V_{DD}$ level, and the output voltage $V_{OUT}$ is abruptly lowered to the $V_{SS}$ level (a second stable condition). In addition, in response to the lowering of the output voltage $V_{OUT}$ to the $V_{SS}$ level, the transistor 44 is turned off. Hence the conduction path including the transistors 44 and 45 is disconnected. That is, the load impedance of the transistor 100 is increased. This variation of the load impedance is added to the above-described gain variation, and therefore the variation of the output condition is promoted.

When the input signal voltage $V_{IN}$ increases further, the output voltage $V_{OUT}$ is maintained in the second stable condition.

Now let the input signal voltage $V_{IN}$ decrease. When the input signal voltage $V_{IN}$ decreases and then becomes equal to the $V_{tH}$ level, either no current or a slight current flows through the transistor 104. Therefore, the transistor 116 maintains the non-conductive condition. As a result, the output voltage $V_{OUT}$ is still kept in the second stable condition.

When the input signal voltage $V_{IN}$ further decreases to the reference voltage $V_{REF}$, substantially equal currents flow through the transistors 100 and 104, respectively. However, since the conduction path of the transistors 42 and 43 is connected in parallel with the conduction path of the transistor 41, a sufficiently large voltage for turning on the transistor 116 cannot be obtained at the gate of the transistor 116. Accordingly, the output voltage $V_{OUT}$ maintains the second stable condition.

When the input signal voltage $V_{IN}$ further decreases to reach the $V'_{tL}$ level, a large part of the current fed from the current source 114 flows through the transistor 104. Accordingly, the drain voltage of the transistor 104 rises to turn on the transistor 116. However, at this moment a sufficient channel is not formed, and therefore, there is only a small reduction of the drain voltage of the transistor 116. For this reason, the transistor 42 stays in the "on" condition. As the input voltage $V_{IN}$ is decreased, the drain voltage of the transistor 116 is reduced (that is the input voltage ($V'_{OUT}$) of the inverter 150 is reduced).

Subsequently, the input voltage ($V'_{OUT}$) of the inverter 150 becomes lower than the threshold level ($V_{DD}/2$) of the inverter 150 responsive to a reduction of the input signal voltage $V_{IN}$ to the $V_{tL}$ level. Then, the output voltage $V_{OUT}$ changes to the $V_{DD}$ level. Consequently, the transistor 44 is turned on. A conduction path consisting of this transistor 44 and the transistor 45 is connected in parallel with the conduction path of the transistor 40. In other words, the load impedance of the transistor 100 is decreased. Then, a part of the current fed from the transistor 100 flows through the transistors 44 and 45. Hence, the current flowing through the transistor 40 reduces, so that the current flowing through the transistor 41 also reduces at the same time. This is because the gates of the transistors 40, 41 and 45 are connected in common.

Therefore, the drain voltage of the transistor 104 rises, and then the transistor 116 is driven into a more intense conductive condition. For this reason, the drain voltage of the transistor 116 is abruptly reduced, to the $V_{SS}$ level, so that the transistor 42 is turned off. As a result, the conduction path of the transistors 42 and 43 disappears to increase the load impedance of the transistor 104. This impedance variation coacts with the above-described decrease of load impedance of the transistor 100 to reinforces the variation of the output. In this way, the input voltage (V'$_{OUT}$) of the inverter 150 is driven to the $V_{SS}$ level, while the output voltage $V_{OUT}$ is driven to the $V_{DD}$ level, so that the first stable condition is established again.

As described above, the hysteresis circuit according to the present invention has an output characteristic such that the output voltage $V_{OUT}$ is inverted at two input levels $V_{tH}$ and $V_{tL}$, the hysteresis voltage width $V_H$ is a voltage which is the difference between voltages $V_{tH}$ and $V_{tL}$. Hereinafter, the input level at which the output voltage $V_{OUT}$ is inverted is described as an "output-inverting input level".

In the hysteresis circuit according to the present invention, upon an inversion of the output into the first or second stable condition, the gain of the differential amplifier consisting of the transistors 100 and 104 is varied. This gain variation is fed back to reinforce the inverting of the output voltage. Moreover, since the gain is varied simultaneously with the inverting of the output, the invertion operation is not influenced by a noise superposed on the input signal. This freedom from influence is especially true in the case of inverting responsive to the above-described first stable condition. More particularly, once the output voltage $V_{OUT}$ is inverted to the $V_{DD}$ level, the conduction path through the transistors 42 and 43, which has been conductive up to that time, is disconnected. The conducting path is completed through the transistors 44 and 45, which had not been conducting up to that time. Accordingly, even if noise is superposed on the input signal voltage $V_{IN}$ at the $V_{tL}$ level, no variation occurs in the output voltage $V_{OUT}$. FIG. 4 shows a waveform 501 of the voltage V'$_{OUT}$ and a waveform 601 of the output voltage $V_{OUT}$.

Thus, the hysteresis circuit according to the present invention presents a desired hysteresis characteristic without employing the above-mentioned resistance voltage-divider circuit. At the same time, it can overcome the instability of the output voltge, possessed by the heretofore known comparator.

The output-inverting input levels $V_{tL}$ and $V_{tH}$ and the hysteresis voltage width $V_H$ is determined by ratios of channel length and width among the transistors 40 to 45, a mutual conductance of the differential amplifier formed by the transistors 100 and 104, current values of the current sources 114 and 120, etc. This means that the output-inverting input levels $V_{tL}$ and $V_{tH}$ can be preset on the both sides of the reference voltage $V_{REF}$ and that a desired hysteresis voltage width $V_H$ can be realized. Accordingly, this freedom of setting both the output-inverting input levels $V_{tL}$ $V_{tH}$ on the upper and lower sides of the reference voltage $V_{REF}$ greatly widens the utilization of the hysteresis circuit, as compared to the heretofore known hysteresis circuit in which one of the output-inverting input levels $V_{tL}$ and $V_{tH}$ is fixed to the reference voltage $V_{REF}$. Still further, the fact that the output-inverting input levels $V_{tL}$ and $V_{tH}$ can be preset at any arbitrary values, implies that it is also possible to make either one of the output-inverting input levels $V_{tL}$ and $V_{tH}$ coincide with the reference voltage $V_{REF}$. Therefore, if it is necessary to make either of the output-inverting input levels $V_{tL}$ or $V_{tH}$ coincide with the reference voltage $V_{REF}$, the present invention can fulfil this requirement without deterioration of an output characteristic. In order to make either the output-inverting input level $V_{tL}$ or $V_{tH}$ coincide with the reference voltage $V_{REF}$, the currents flowing respectively through the transistors 40 and 41 may be differentiated from each other by a current corresponding to the current flowing through the transistors 43 or 45. For instance, in order to make the $V_{tH}$ level coincide with the reference voltage $V_{REF}$, the channel width of the transistor 41 is made equal to the sum of the channel widths of the transistors 40 and 45. At this moment, it is assumed that the channel lengths of the transistors 40, 41 and 45 are identical to each other. On the other hand, in order to make the $V_{tL}$ level coincide with the reference voltage $V_{REF}$, the channel width of the transistor 40 may be designed as being equal to the sum of the channel widths of the transistors 41 and 43. In this case also, the channel lengths of these transistors 40, 41 and 43 are assumed to be identical to each other.

As described above, the hysteresis circuit according to the present invention not only can provide a stable and steep output voltage waveform, but also can preset the hysteresis voltage and the output-inverting input levels at any arbitrary values.

Figure 5:
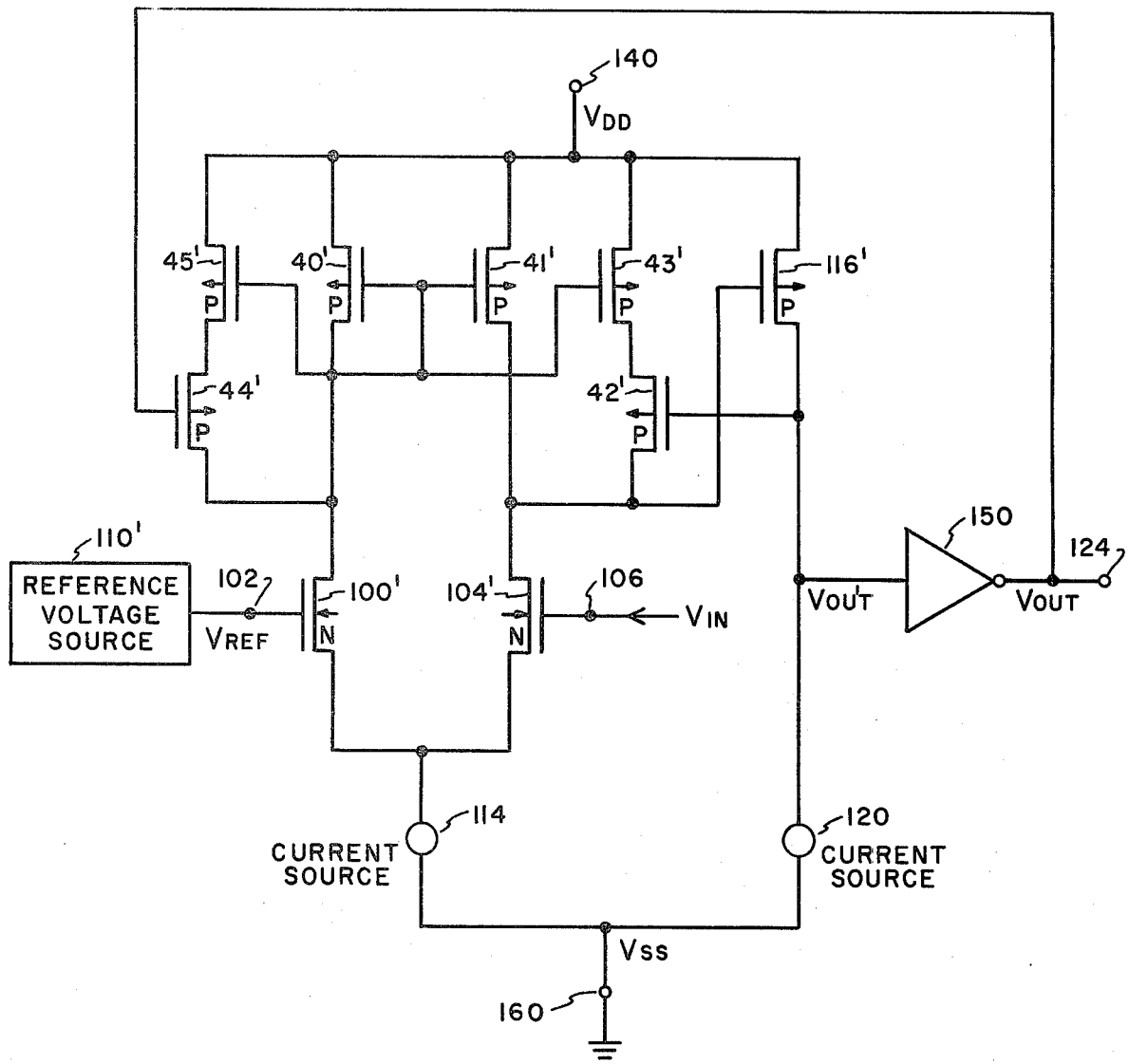
FIG. 5 is a circuit diagram of a hysteresis circuit according to another preferred embodiment of the present invention.

The circuit shown in FIG. 3 can also be by interchanging the conductivity types of all transistors. FIG. 5 shows such a modified circuit. More particularly, the P-MOS transistors 100 and 104 are replaced by N-MOS transistors 100' and 104'. The remaining N-MOS transistors 40 to 45 and 116 are replaced by P-MOS transistors 40' to 45' and 116'. The interconnections between the respective transistors are identical to those shown in FIG. 3, only the connections to the power supply terminals 140 and 160 are reversed.

Figure 4:
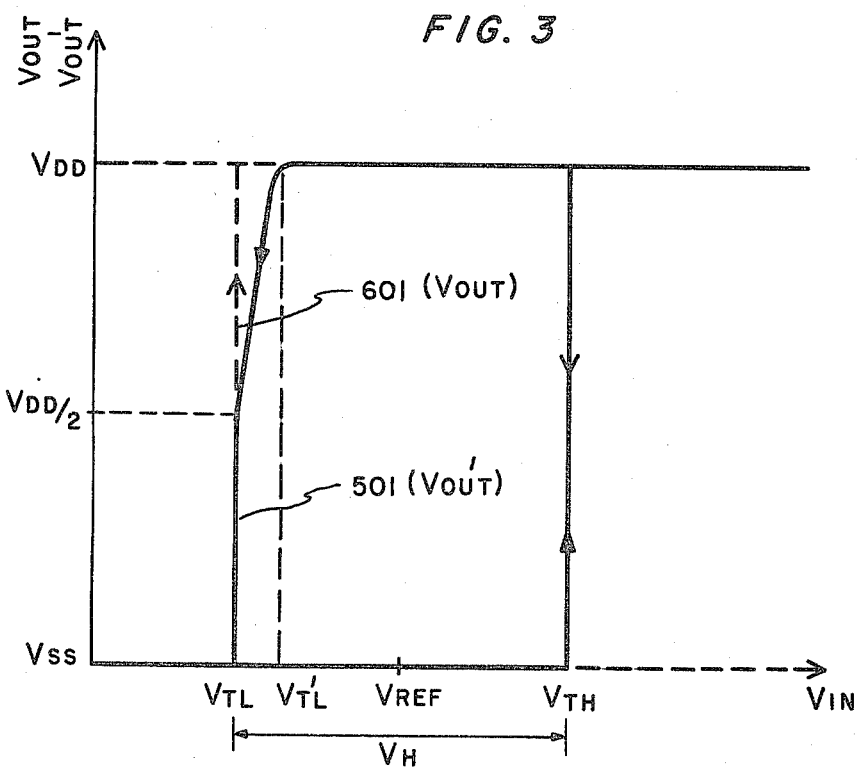
FIG. 4 is a waveform diagram showing a relationship of an input signal voltage versus an output signal voltage of the circuit shown in FIG. 3.

A waveform of an output voltage $V_{OUT}$ provided by this modified circuit is identical to that shown in FIG. 4, which is steep and stable.

It should be noted that FIGS. 3 and 5 illustrated merely two alternative examples of the hysteresis circuit according to the present invention and various changes and modifications could be made to there examples. For instance, modification may be made such that an input signal voltage $V_{IN}$ is applied to the transistor 100 and the transistor 104 receives a reference voltage $V_{REF}$. In this case, the voltage waveforms for the output voltage $V_{OUT}$ and the input voltage V'$_{OUT}$ of the inverter 150 are inversion of the waveforms shown in FIG. 4. In addition, although the inverter 150 is normally composed of a series connection of a P-MOS transistor and an N-MOS transistor, it can be also composed of a load MOS transistor and an active MOS transistor or of a load resistor and an active MOS transistor. Furthermore, the drain output of the transistor 100 could be employed as an output of the differential amplifier. A plurality of amplifier stages may be interposed between the output of the differential amplifier and the inverter 150. It is also possible to apply the output voltage $V_{OUT}$ of the inverter 150 to the gate of the transistor 42 and to apply the input voltage V'$_{OUT}$ of the inverter 150 to the gate of the transistor 44. Still further, the present invention can be practiced by employing the CMA shown in FIG. 2 of the above-referred U.S. Pat. No. 4,069,431 as a load circuit of the transistors 100 and 104. More particularly, the terminal 14 in FIG. 2 of the U.S. patent is connected to the drain of the transistor 104, and the terminal 12 in the same figure is connected to the drain of the transistor 100. The gate of the transistor 24 in FIG. 2 of the U.S. patent is connected to the drain of the transistor 116. Furthermore, in parallel with the transistor 18b in FIG. 2 of the U.S. patent is connected an N-MOS transistor, and the gate of this N-MOS transistor is connected to the output terminal 124. In a circuit having such a construction the gains of the CMA is varied, upon every inversion of the output voltage. Consequently, an output characteristic is scarcely influenced by a noise. In addition, although the load of the differential amplifier is an active load of the current mirror circuit employing transistors, the transistors 40 and 41 may be replaced by resistors. The transistors 43 and 45 are also replaceable by resistors. The transistors 42 and 44 are replaced by circuit elements having a switching function. While the present invention has been described above in connection to insulated gate field effect transistors, the subject circuit could be constructed of bipolar transistors.

What is claimed is:

1. A comparator comprising first and second input terminals, an output terminal, a first transistor having a control electrode connected to the first input terminal, a second transistor having a control electrode connected to the second input terminal, said first and second transistors being interconnected to form a differential amplifier, a first load connected to the first transistor, a second load connected to the second transistor, a phase-inverter, means for supplying an output of said differential amplifier to said phase-inverter, first switching means for establishing a first conduction path in parallel with said first load, said first switching means being controlled by an output of said phase-inverter, second switching means for establishing a second conduction path in parallel with said second load, said second switching means being controlled by an input to said phase-inverter, and means for coupling the output of said phase-inverter to said output terminal.

2. A comparator as claimed in claim 1, in which an input signal is applied to said first input terminal and a fixed voltage is applied to said second input terminal.

3. A comparator as claimed in claim 1, in which said first and second transistors are insulated gate field effect transistors, said first and second transistors being of one conductivity type, and said first and second switching means respectively include third and fourth insulated gate field effect transistors, said third and fourth transistors being of the opposite conductivity type.

4. A comparator as claimed in claim 3, in which said first load circuit includes a fifth insulated gate field effect transistor having a gate and drain connected in common, said second load circuit includes a sixth insulated gate field effect transistor having a gate connected to the gate of said fifth insulated gate field effect transistor, and said first and second conduction paths, respectively, include seventh and eighth insulated gate field effect transistors each having a gate connected to the gate of said fifth insulated gate field effect transistor.

5. A comparator comprising a differential amplifier supplied with an input signal voltage and a reference voltage, an output terminal, at least one amplifier stage for amplifying an output of said differential amplifier, a phase-inversion amplifier for inverting the phase of an output of said amplifier stage, means for applying an output of said phase-inversion amplifier to said output terminal, and circuit means including a feedback circuit from the input and the output of said phase-inversion amplifier to said differential amplifier for varying the gain of said differential amplifier each time the output signal condition at the output terminal varies.

6. A comparator as claimed in claim 5, in which said differential amplifier has a load circuit, and said feedback circuit includes a conduction path in parallel with said load circuit.

7. A comparator as claimed in claim 6, in which said differential amplifier includes a first transistor for receiving said input signal voltage and a second transistor for receiving said reference voltage, said load circuit includes a first load coupled to said first transistor and a second load coupled to said second transistor, said conduction path includes a first conduction path in parallel with said first load and a second conduction path in parallel to said second load, and said first and second conduction paths responding with the input and output of said phase-inversion amplifier for shunting a part of the current flowing through said load circuit.

8. A comparator comprising first and second input terminals, an output terminal; a first transistor having gate, drain, and source, said gate being connected to said first input terminal; a second transistor having gate, drain, and source, said gate connected to said second input terminal; said first and second transistors forming a differential amplifier circuit; a third transistor having gate, drain, and source, the drain-source path being connected in series with the drain-source path of said first transistor; a fourth transistor having gate, drain, and source, the drain-source path being connected in series with said drain-source path of the second transistor; the gate and drain of said third transistor and the gate of said fourth transistor being connected in common; a first circuit including fifth and sixth transistors each having gate, source and drain, said fifth and sixth transistors being connected in series with each other; a second circuit including seventh and eighth transistors each having gates and being connected in series with each other; said first circuit being connected in parallel with said third transistor, said second circuit being connected in parallel with said fourth transistor; the gates of said third, fifth and seventh transistors being connected in common; a ninth transistor having gate, source and drain, the gate being connected to the output of said differential amplifier circuit; and a phase-inversion amplifier having an input end connected to the drain of said ninth transistor, an output end of said phase-inversion amplifier being connected to said output terminal; the gate of said sixth transistor being connected to the output end of said phase-inversion amplifier, and the gate of said eighth transistor being connected to the input end of said phase-inversion amplifier.

9. A comparator as claimed in claim 8, in which said first to ninth transistors are insulated gate field effect transistors, the first and second transistors being of one conductivity type, and the third to ninth transistors being of the opposite conductivity type.

10. A comparator as claimed in claim 8, in which one of an input signal voltage and a reference voltage is applied to said first input terminal and the other is applied to said second input terminal.

11. A circuit comprising a differential amplifier having first and second sides and first and second variable impedance load circuit means respectively associated with and coupled to said first and second sides, an inverter circuit means having an input end and an output end, means for coupling said differential amplifier to the input end of said inverter circuit means, and a feedback circuit means for feeding a first feedback signal from the input end of said inverter circuit means to said first variable impedance load circuit means and a second feedback signal from the output end of said inverter circuit means to said second variable impedance load circuit means to vary the impedances of said first and second variable impedance load circuit means in response to voltage levels at the input and output ends of said inverter circuit.

12. The circuit of claim 11, wherein said first and second variable impedance load circuit means comprise first and second electronic switch means, respectively, said first and second electronic switch means being turned on or off alternatively responsive to said first and second feedback signals.

13. The circuit of claim 12, wherein said first variable impedance load circuit means further comprises first and second impedance means, said first electronic switch means and said first impedance means being coupled in series between both ends of said second impedance means, and said second variable impedance load circuit means further comprises third and fourth impedance means, said second electronic switch means and said third impedance means being coupled in series between both ends of said fourth impedance means.

14. The circuit of claim 12 wherein each of said first and second electronic switch means is a MOS device.

15. The circuit of claim 13 wherein each of said first and fourth impedance means is a MOS device.

* * * * *